United States Patent
Oh et al.

(10) Patent No.: US 6,410,841 B1
(45) Date of Patent: Jun. 25, 2002

(54) THERMAL EVOLVING METHOD AND APPARATUS FOR PLASMA DISPLAY PANEL

(75) Inventors: Jin Mok Oh; Jeong Jun Kim, both of Kyungsangbuk-do (KR)

(73) Assignee: LG Electronics Inc., Seoul (KR)

(*) Notice: Subject to any disclaimer, the term of this patent is extended or adjusted under 35 U.S.C. 154(b) by 0 days.

(21) Appl. No.: 09/698,218

(22) Filed: Oct. 30, 2000

(30) Foreign Application Priority Data

Oct. 29, 1999 (KR) .............................. 99-47372

(51) Int. Cl.[7] .................. H01L 35/02; H01L 35/28; H01L 35/30; H01J 17/49
(52) U.S. Cl. .................. 136/242; 136/203; 136/205; 313/582
(58) Field of Search ................... 136/203, 224, 136/227, 242; 62/3.3; 313/582

(56) References Cited

U.S. PATENT DOCUMENTS

| 2,983,031 A | * | 5/1961 | Blanchard | 136/224 |
| 5,448,109 A | * | 9/1995 | Cauchy | 136/203 |
| 5,990,618 A | * | 11/1999 | Morita et al. | 313/582 |

FOREIGN PATENT DOCUMENTS

| DE | 19504923 | 8/1996 |
| JP | 11-233028 | 8/1999 |

* cited by examiner

*Primary Examiner*—Bruce F. Bell
*Assistant Examiner*—Thomas H. Parsons
(74) *Attorney, Agent, or Firm*—Fleshner & Kim, LLP

(57) ABSTRACT

A thermal evolving method and apparatus for a plasma display panel method that is adaptive for reducing a noise as well as a thickness of the plasma display panel. In the method and apparatus, at least one of a Peltier effect and a Thomson effect is used to refrigerate the plasma display panel.

25 Claims, 6 Drawing Sheets

THERMAL EVOLVING METHOD AND APPARATUS FOR PLASMA DISPLAY PANEL

BACKGROUND OF THE INVENTION

1. Field of the Invention

This invention relates to a plasma display panel, and more particularly to a thermal evolving method and apparatus for a plasma display panel method that is adaptive for reducing a noise as well as a thickness of the plasma display panel.

2. Description of the Related Art

Generally, a plasma display panel (PDP) is a light-emitting device which displays a picture using a gas discharge phenomenon within the cell. This PDP does not require providing an active device for each cell like a liquid crystal display (LCD). Accordingly, the PDP has a simple fabrication process and hence has the advantage of providing a large-dimension screen.

Such a PDP has a number of discharge cells arranged in a matrix type. The discharge cells are provided at each intersection between sustaining electrode lines for sustaining a discharge and address electrode lines for selecting the cells to be discharged.

Referring to FIG. 1, each cell of the AC-type, three-electrode PDP includes a front substrate 10 provided with a sustainng electrode pair 12A and 12B, and a rear substrate 18 provided with an address electrode 20. The front substrate 10 and the rear substrate 18 are spaced in parallel to each other with barrier ribs 24 therebetween and sealed with a frit glass. A mixture gas, such as Ne—Xe or He—Xe, etc., is injected into a discharge space defined by the front substrate 10, the rear substrate 18 and the barrier ribs 24. Two sustaining electrodes 12A and 12B make a sustaining electrode pair within a single plasma discharge channel. Any one electrode of the sustaining electrode pair 12A and 12B is used as a scanning electrode that responds to a scanning pulse applied in an address interval to cause an opposite discharge along with the address electrode 20 while responding to a sustaining pulse applied in a sustaining interval to cause a surface discharge along with the other adjacent sustaining electrode. Also, the sustainng electrode 12B or 12A adjacent to the sustaining electrode 12A or 12B used as the scanning electrode is used as a common sustaining electrode to which a sustaining pulse is applied commonly.

The sustaining electrode pair 12A and 12B includes transparent electrodes 30A and 30B and metal electrodes 28A and 28B connected electrically to each other, respectively. The transparent electrodes 30A and 30B are formed by depositing indium thin oxide (ITO) on the front substrate 10. The metal electrodes 28A and 28B are deposited on the front substrate 10 to have a three-layer structure of Ag or Cr—Cu—Cr. The metal electrodes 28A and 28B play a role to reduce a voltage drop caused by the transparent electrodes 30A and 30B.

On the front substrate 10 provided with the sustaining electrodes 12A and 12B, a dielectric layer 14 and a protective layer 16 are disposed. The dielectric layer 14 is responsible for limiting a plasma discharge current as well as accumulating a well charge during the discharge. The protective layer 16 prevents a damage of the dielectric layer 14 caused by the sputtering generated during the plasma discharge and improves the emission efficiency of secondary electrons. This protective layer 16 is usually made from MgO. The rear substrate 18 is provided with a dielectric thick film 26 covering the address electrode 20. The barrier ribs 24 for dividing the discharge space are extended perpendicularly at the rear substrate 18. On the surfaces of the rear substrate 18 and the barrier ribs 24, a fluorescent material 22 excited by a vacuum ultraviolet lay to generate a visible light is coated.

Since such a PDP takes advantages of a gas discharge upon driving, it inevitably generates a high-temperature heat. This high-temperature heat makes an adverse affect to a stable driving and a life of the PDP. In order to evolve such a high-temperature heat into the exterior of the PDP, the PDP is provided with a thermal evolving apparatus. This thermal evolving apparatus evolves a heat generated from the PDP into the exterior by a ventilation system using a fan like other electronic devices.

Referring to FIG. 2 and FIG. 3, the thermal evolving apparatus for the PDP includes a heat evolution plate 33 opposed to the rear surface of the PDP, and a plurality of fans 37 installed at a rear case 36 of the PDP 30. In the PDP 30, discharge cells are provided between two sheets of glass substrates 10 and 18. The heat evolution plate 33 is usually made from a metal having a high thermal conductivity, for example, aluminum. Thermal conductive sheets 32 and 34 are provided between the heat evolution plate and the PDP. The thermal conductive sheets 32 and 34 protect the rear surface of the PDP 30 and allow the heat evolution plate 33 of a metal material to be easily attached to the PDP 30. A heat generated from the PDP 30 is conducted, via the thermal conductive sheets 32 and 34, into the heat evolution plate 33. The rear side of the heat evolution plate 33 is provided with a printed circuit board (PCB) 38 mounted with driving circuits. The PDP 30, the heat evolution plate 33 and the PCB 38 are mounted within a space provided between a front case 35 and a rear case 36. The fan 37 evolves a heat on the heat evolution plate 33 into the exterior to make a compulsory convection of a heat generated from the PDP with an external air.

Upon driving of the PDP 30, the PDP 30 generates a high-temperatue heat by a gas discharge and a major portion of this heat is conducted into the heat evolution plate 33. The heat on the heat evolution plate 33 conducted in this manner is subject to a compulsory convection with an external air by the heat evolution fan 37. A portion of the heat is evolved via the front substrate 10 by a natural convection with an external air. In other words, the heat generated from the PDP 30 is evolved via two paths. One path I is a path in which a heat generated from the PDP 30 is removed through convection and radiation through the external air via the front substrate 10 by a conduction of the heat. Other path II is a path in which a heat generated from the PDP 30 is conducted, via the rear substrate 18 and the thermal conductive sheets 32 and 34, into the thermal evolution plate 33 and thereafter makes a compulsory convection with an external air by the fan 37. Since the former path I is at a front side of the PDP where a picture is displayed, it can not control a heat evolution. Accordingly, a heat evolution of the PDP 30 is mainly made via the latter path II. The heat evolution plate 33 and a plurality of fans 37 are installed at the latter path II to evolve a heat generated from the PDP 30 by a compulsory convection system.

However, the conventional thermal evolving apparatus for the PDP 30 has an even heat evolution effect, but fails to obtain a satisfying heat evolution efficiency. For this reason, in spite of an installation of the thermal evolving apparatus, a temperature of the PDP 30 has a high value of about 40 to 50° C. upon driving of the PDP 30. If a temperature of the PDP 30 is kept at a high value, then the fluorescent material 22 and the electrodes 12A, 12B and 20, etc. may be deteriorated and the PDP 30 is driven for a long time. Also, a clear picture can not be displayed and the PDP 30 may be damaged due to an overheating. Furthermore, the thermal evolving apparatus of the PDP 30 has a problem in that, since it must always drive the heat evolution fan 37 so as to make a heat evolution upon driving, a power consumption as well as a noise becomes large. Moreover, since the thermal evolving apparatus of the PDP 30 must assure a space for an installation of the heat evolution fan 37, a thickness T of a PDP set becomes large as shown in FIG. 3.

SUMMARY OF THE INVENTION

Accordingly, it is an object of the present invention to provide a thermal evolving method and apparatus for a plasma display panel that is capable of reducing a noise as well as a thickness of the plasma display panel.

In order to achieve these and other objects of the invention, a thermal evolving method for a plasma display panel according to one aspect of the present invention includes refrigerating a panel displaying an image by a gas discharge using at least one of a Peltier effect and a Thomson effect.

A thermal evolving apparatus for a plasma display panel according to another aspect of the present invention includes a panel displaying an image by a gas discharge; and electron refrigerating means for taking advantage of at least one of a Peltier effect and a Thomson effect to refrigerate the panel.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE INVENTION

Figure 4:
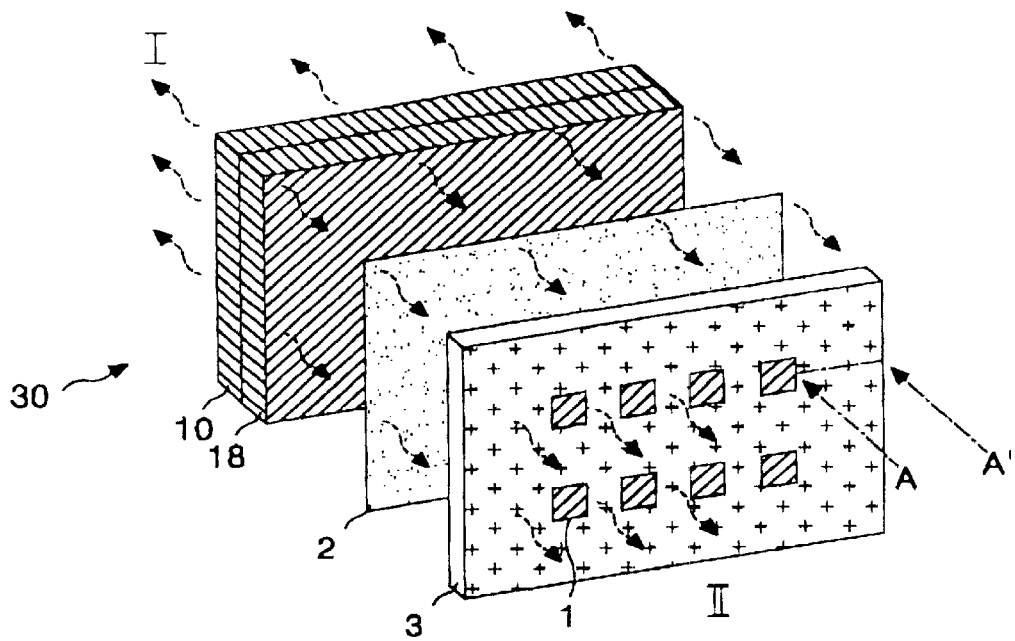
FIG. 4 is an exploded perspective view showing a structure and a heat evolution path of a thermal evolving apparatus for a PDP according to an embodiment of the present invention.
Figure 5:
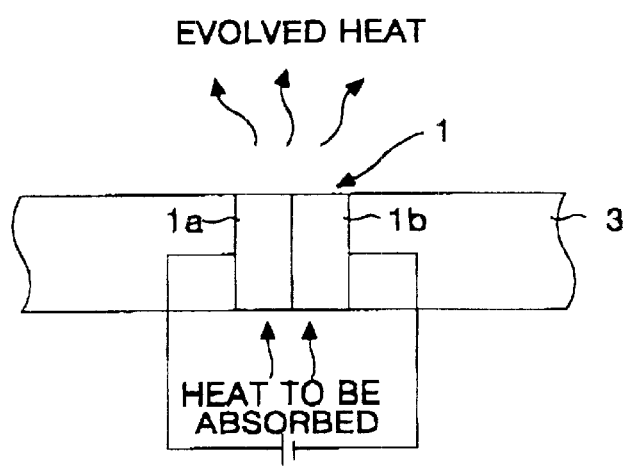
FIG. 5 is a section of a thermoelectric device taken along the A-A' line in FIG. 4.

Referring to FIG. 4, there is shown a thermal evolving apparatus for a plasma display panel (PDP) according to an embodiment of the present invention. The present thermal evolving apparatus includes a heat evolution plate 3 attached to the PDP 30 with having a heat conductive sheet 2 therebetween, and a plurality of thermoelectric devices 1 installed at the heat evolution plate 3. The thermal conductive sheet 2 protects the rear side of the PDP 30 and allows the heat evolution plate 3 of a metal material to be easily attached to the PDP 30. A heat generated from the PDP 30 is conducted, via the heat conductive sheet 2, into the heat evolution plate 3. The thermoelectric device 1 plays a role to evolve a heat on the heat evolution plate 3 using a Peltier effect or a Thomson effect. To this end, the thermoelectric device 1 is made by bonding dissimilar thermoelectric semiconductors or dissimilar metals with each other. The peltier effect means that, when an electric current flows across a junction between two dissimilar semiconductor materials, an evolution or absorption of heat is created in proportion to a current value. The evolution or absorption of heat becomes different depending on a direction of the current. The thermal conductive apparatus for the PDP according to the present invention takes advantages of a heat absorption in the Peltier effect. The Thomson effect corresponds to a reverse of a Seebeck effect. The Thomson effect means that an evolution or absorption of heat proportional to a voltage value and a temperature gradient when a voltage is applied across two positions of two dissimilar metal conducting wires is created. Herein, when a voltage is applied from a high-temperature position into a low-temperature position, electrons absorb a heat at the high-temperature position to be used for thermoelectric refrigeration. These thermoelectric devices 1 are arranged at a uniform distance on the heat evolution plate 3 so as to uniformly refrigerate the PDP 30. A refrigeration ability of a thermal evolving apparatus mounted with these thermoelectric devices 1 can be controlled by an adjustment of the number of thermoelectric devices 1, or a current level or a voltage level of a power supply.

In the case of using the Peltier effect, the thermoelectric device 1 is made by a junction of a n-type thermoelectric semiconductor 1a to a p-type thermoelectric semiconductor 1b. For example, the thermoelectric device 1 can be made by a junction of $Bi_2Te_3$ with $Sb_2Se$. If a direct current is applied across the thermoelectric semiconductors 1a and 1b of the thermoelectric device 1, a temperature difference is created across the thermoelectric semiconductors 1a and 1b by a thermoelectric effect. Then, at a front junction of the thermoelectric semiconductors 1a and 1b, electrons absorbing a thermal energy from the periphery thereof are moved to absorb a heat on the PDP 30. At the same time, the thermoelectric semiconductors 1a and 1b evolve a heat absorbing from the exterior thereof.

Figure 6:
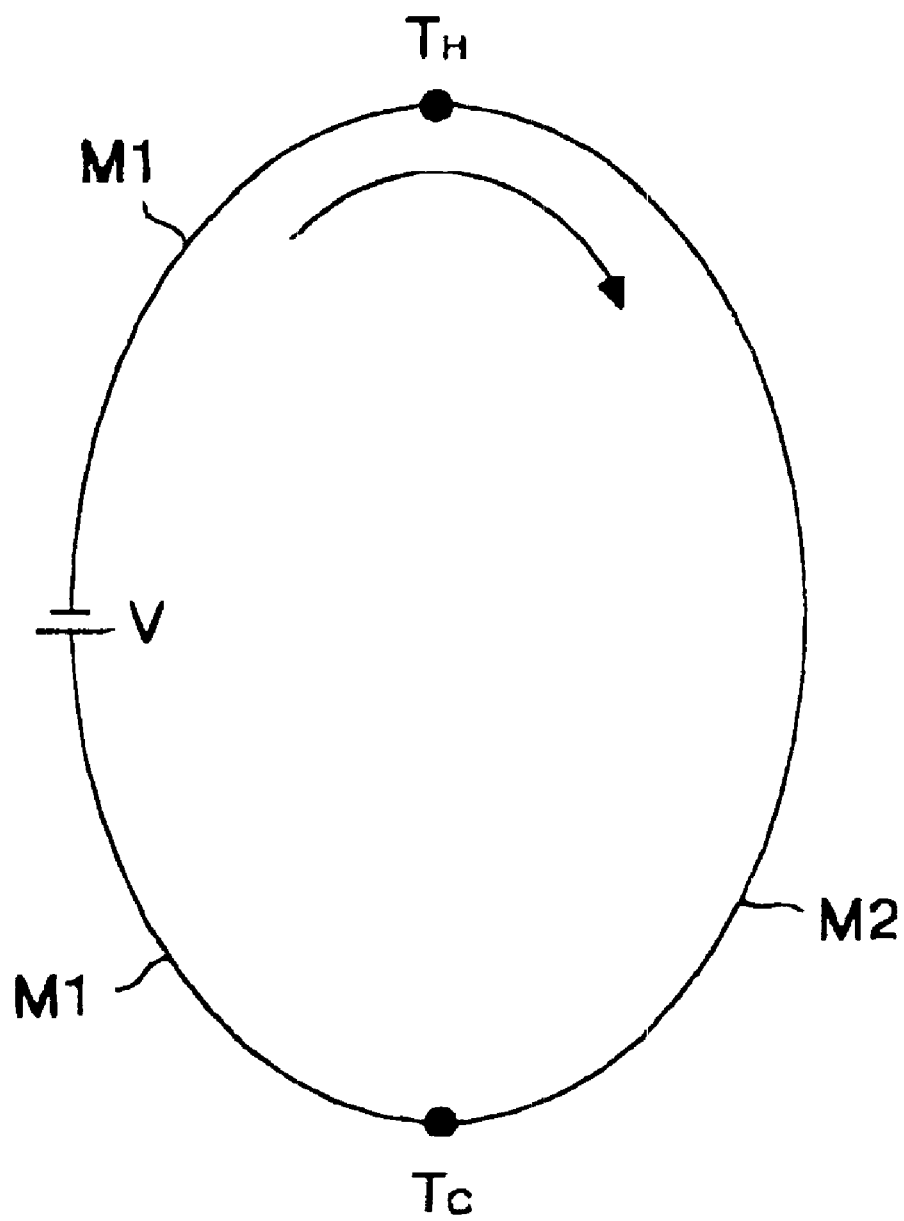
FIG. 6 is an equivalent circuit diagram of a heat evolution path of the thermoelectric device shown in FIG. 4.

On the other hand, in the case of using the Thomson effect, the thermoelectric device 1 connects dissimilar metals M1 and M2, for example, Fe and Cu in a wire shape to each other to form a closed loop as shown in FIG. 6. If a voltage is applied across two positions $T_H$ and $T_C$ of dissimilar metals having a temperature difference in this closed loop, then electrons absorb a heat at the high-temperature position $T_H$ inputted with a supplied power and moves it into the low-temperature position $T_C$. Herein, the PDP 30 can be refrigerated by directing the high-temperature position $T_H$ to the PDP 30 and directing the low-temperature position $T_C$ to the exterior.

Figure 1:
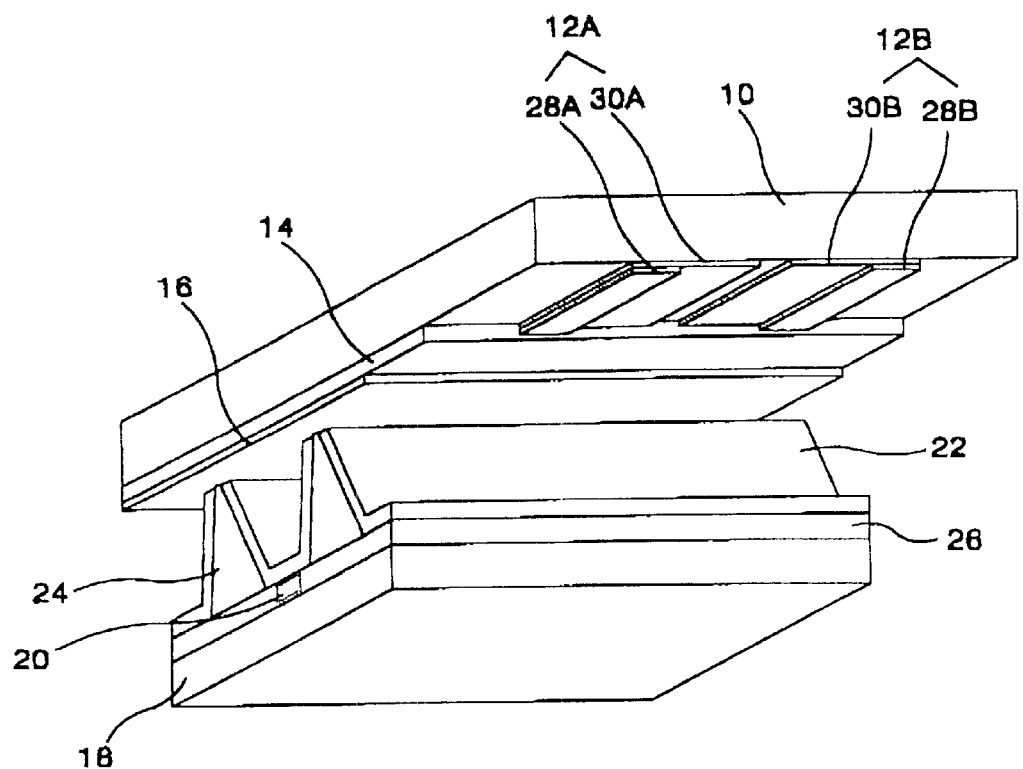
FIG. 1 is a perspective view showing a structure of a conventional AC-type plasma display panel.
Figure 2:
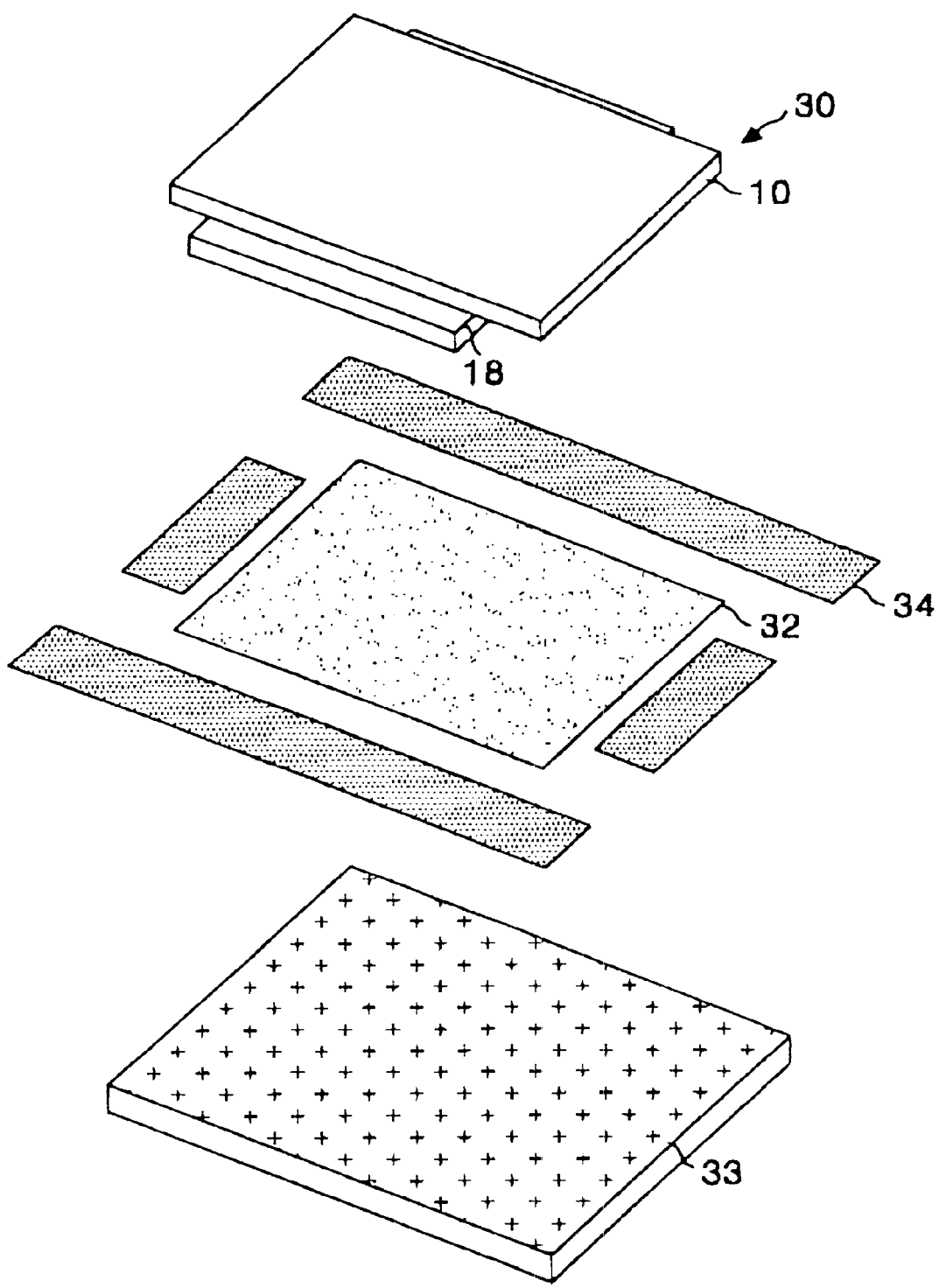
FIG. 2 is an exploded perspective view showing a structure of a conventional thermal evolving apparatus for a PDP.
Figure 3:
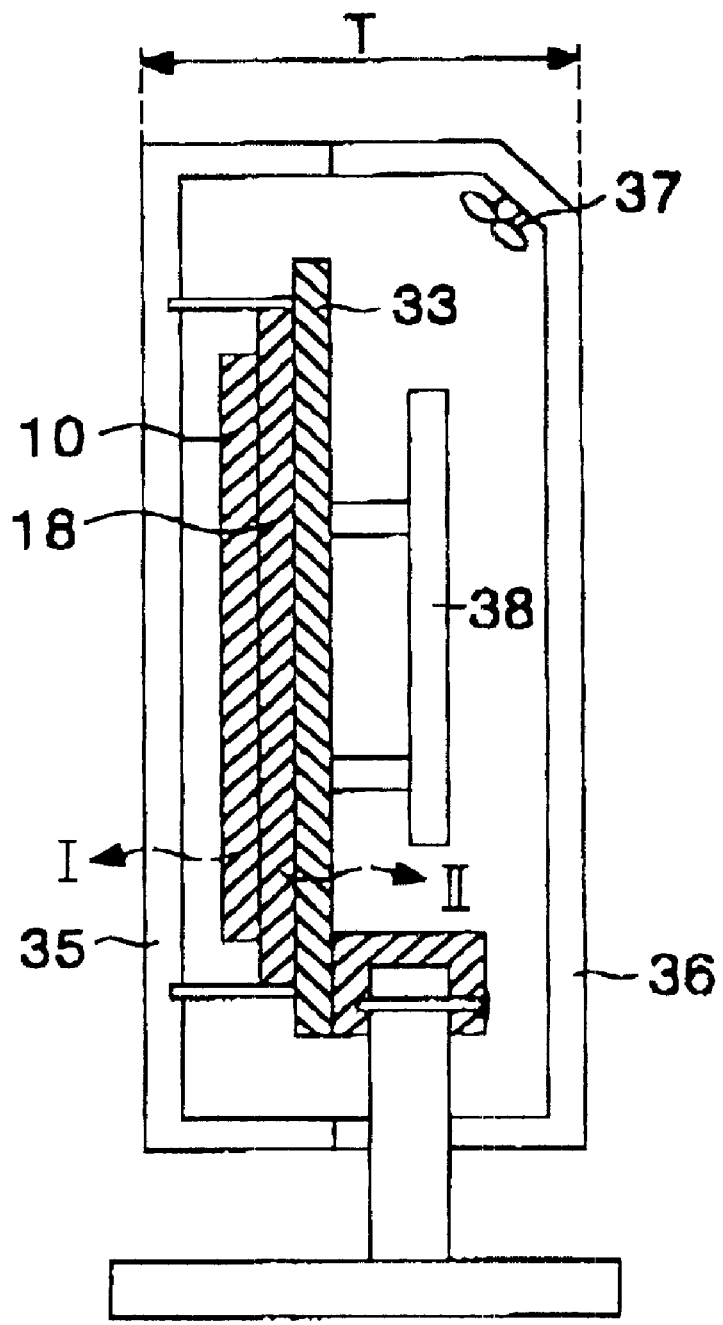
FIG. 3 is a section view of a PDP set provided with the thermal evolving apparatus shown in FIG. 2.
Figure 7:
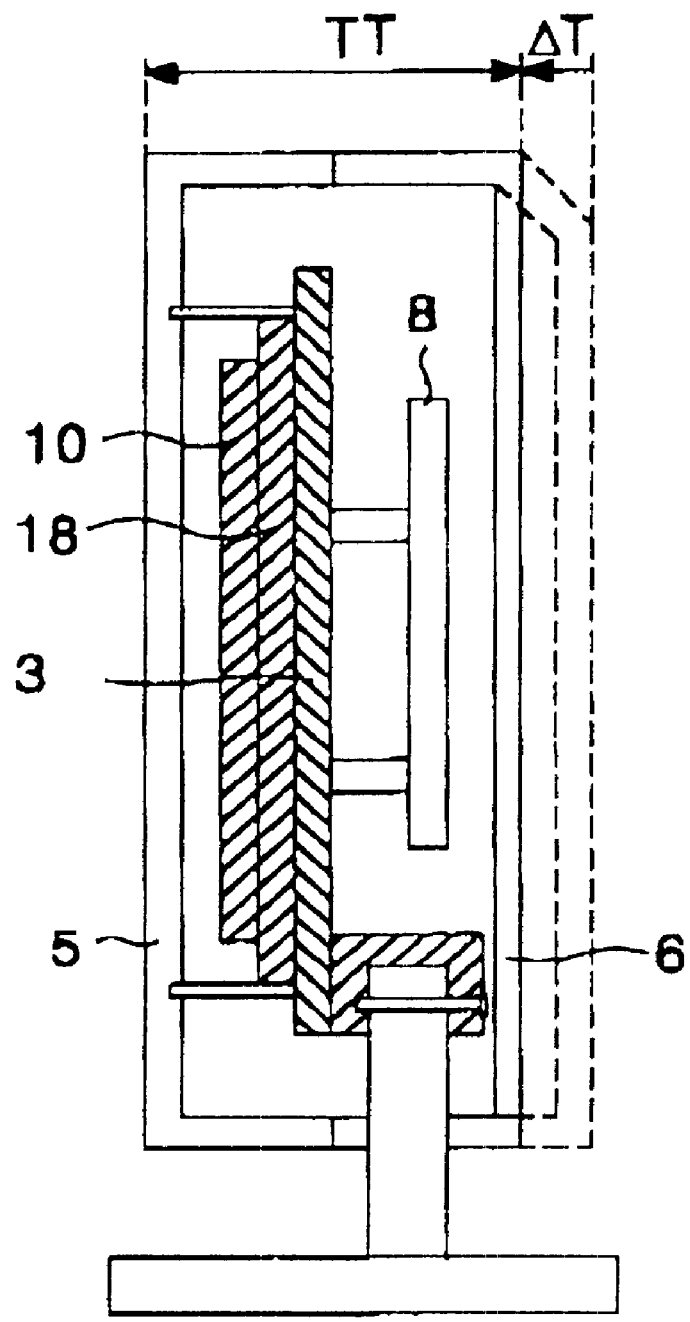
FIG. 7 is a section view of the PDP set provided with the thermal evolving apparatus shown in FIG. 4.

Referring to FIG. 7, the PDP set provided with the thermal evolving apparatus according to the present invention has a thickness reduced by $\Delta T$ in comparison to that shown in FIG. 3. In other words, the present PDP set does not need a space for an installation of the fan in the prior art, so that it can be thinned into a thickness of $TT(T-\Delta T)$. The heat evolution plate 3 is provided with a plurality of thermoelectric devices 1 and is made from a metal having a high thermal conductivity. A PCB 8 mounted with drive circuits is installed at the rear side of the heat evolution plate 3. The PDP 30, the heat evolution plate 3 provided with the thermoelectric devices 1 and the PCB 8 are mounted within a space defined between the front case 5 and the rear case 6.

As described above, the thermal evolving method and apparatus for PDP according to the present invention takes advantages of an electron refrigeration principle to lower a heat generated from the PDP. Accordingly, the present thermal evolving method and apparatus does not need the fan, so that it is capable of reducing a noise as well as an entire thickness and a load of the PDP set. Also, the present evolving method and apparatus can reduce a power wasted by the fan. Furthermore, the present thermal evolving method and apparatus can dramatically reduce a temperature of the panel by a control in the number of thermoelectric devices in comparison to the fan system to improve a luminescence efficiency of the fluorescent material as well as a uniformity of the entire screen.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A thermal evolving apparatus for a plasma display panel comprising:
   a panel displaying an image by a gas discharge and;
   a Thomson effect thermoelectric device thermally attached to the panel.

2. The thermal evolving apparatus as claimed in claim 1, wherein the thermoelectric device comprises a thermal conducting circuit comprising at least two dissimilar metal wires connected in a shape of closed loop to refrigerate the panel by a supplied power and produce a Thomson effect.

3. The thermal evolving apparatus as claimed in claim 1, further comprising at least two Peltier effect thermoelectric devices.

4. The thermal evolving apparatus as claimed in claim 1, further comprising a Peltier effect thermoelectric device.

5. The thermal evolving apparatus as claimed in claim 4, wherein the Peltier effect thermoelectric device is embedded in a metal heat evolution plate and wherein the plate is thermally connected to the panel.

6. The thermal evolving apparatus as claimed in claim 4, wherein the Peltier effect thermoelectric device comprises a junction of $Bi_2Ti_3$ and $Sb_2Se$.

7. The thermal evolving apparatus as claimed in claim 1, wherein the Thomson effect thermoelectric device is arranged on a metal heat evolution plate thermally connected to the panel.

8. The thermal evolving apparatus as claimed in claim 1, wherein the device is directly in contact with the panel.

9. A thermal evolving apparatus for a plasma display panel comprising:
   a panel displaying an image by a gas discharge; and
   at least two Peltier effect thermoelectric devices thermally attached to and uniformly spaced on the panel to refrigerate the panel.

10. The thermal evolving apparatus as claimed in claim 9, wherein the thermoelectric devices are embedded in a metal heat evolution plate for conducting heat away from the panel, wherein the plate is thermally connected to the panel.

11. The thermal evolving apparatus as claimed in claim 9, wherein the thermoelectric devices comprise an n-type thermoelectric semiconductor and a p-type thermoelectric semiconductor capable of producing a Peltier effect.

12. The thermal evolving apparatus as claimed in claim 9, wherein the thermoelectric devices comprise a power source for supplying a junction of the thermoelectric devices with a direct current.

13. The thermal evolving apparatus as claimed in claim 9, wherein the refrigeration ability of the thermoelectric devices varies with the amount of supplied power.

14. The thermal evolving apparatus as claimed in claim 9, wherein each of the at least two Peltier effect thermoelectric devices comprise $Bi_2Te_3$ and $Sb_2Se$.

15. The thermal evolving apparatus as claimed in claim 9, further comprising a Thomson effect thermoelectric device arranged on a metal heat evolution plate thermally connected to the panel.

16. The thermal evolving apparatus as claimed in claim 9, wherein the devices are directly in contact with the panel.

17. A thermal evolving apparatus for a plasma display panel, comprising:
   a plasma display panel;
   a heat evolution plate thermally connected to said panel; and
   a Peltier effect thermoelectric device embedded in said plate.

18. A thermal evolving apparatus for a plasma display panel as claimed in claim 17, wherein the device comprises an n-type thermoelectric semiconductor and a p-type thermoelectric semiconductor capable of producing a Peltier effect to refrigerate said panel.

19. A thermal evolving apparatus for a plasma display panel as claimed in claim 17, further comprising at least two Thomson effect thermoelectric devices arranged on the heat evolution plate thermally connected to the panel.

20. A thermal evolving apparatus for a plasma display panel as claimed in claim 17, wherein the device comprises one section of $Bi_2Te_3$ and another section of $Sb_2Se$.

21. The thermal evolving apparatus as claimed in claim 17, wherein the device is directly in contact with the panel.

22. A thermal evolving apparatus for a plasma display panel, comprising:
   a plasma display panel;
   a heat evolution plate thermally connected to said panel; and
   a Peltier effect thermoelectric device comprising one section of $Bi_2Te_3$ and other section of $Sb_2Se$ thermally attached to said plate.

23. A thermal evolving apparatus for a plasma display panel as claimed in claim 22, wherein the apparatus comprises at least two Peltier effect thermoelectric devices embedded in said heat evolution plate.

24. A thermal evolving apparatus for a plasma display panel as claimed in claim 22, further comprising at least two Thomson effect thermoelectric devices thermally connected to said heat evolution plate.

25. The thermal evolving apparatus as claimed in claim 22, wherein the device is directly in contact with the panel.

* * * * *